United States Patent
Narayan

(10) Patent No.: US 11,011,514 B2
(45) Date of Patent: May 18, 2021

(54) DOPING AND FABRICATION OF DIAMOND AND C-BN BASED DEVICE STRUCTURES

(71) Applicant: North Carolina State University, Raleigh, NC (US)

(72) Inventor: Jagdish Narayan, Raleigh, NC (US)

(73) Assignee: North Carolina State University, Raleigh, NC (US)

(*) Notice: Subject to any disclaimer, the term of this patent is extended or adjusted under 35 U.S.C. 154(b) by 34 days.

(21) Appl. No.: 16/485,052

(22) PCT Filed: Feb. 5, 2018

(86) PCT No.: PCT/US2018/016870
§ 371 (c)(1),
(2) Date: Aug. 9, 2019

(87) PCT Pub. No.: WO2018/148147
PCT Pub. Date: Aug. 16, 2018

(65) Prior Publication Data
US 2019/0363078 A1 Nov. 28, 2019

Related U.S. Application Data

(60) Provisional application No. 62/456,706, filed on Feb. 9, 2017.

(51) Int. Cl.
| | | |
|---|---|---|
| *H01L 27/06* | (2006.01) |
| *C30B 25/18* | (2006.01) |
| *C30B 29/04* | (2006.01) |
| *H01L 29/04* | (2006.01) |
| *H01L 29/16* | (2006.01) |
| *H01L 29/20* | (2006.01) |
| *H01L 29/267* | (2006.01) |
| *H01L 29/737* | (2006.01) |

(Continued)

(52) U.S. Cl.
CPC .......... *H01L 27/0664* (2013.01); *C30B 25/18* (2013.01); *C30B 29/04* (2013.01); *H01L 29/045* (2013.01); *H01L 29/1602* (2013.01); *H01L 29/2003* (2013.01); *H01L 29/267* (2013.01); *H01L 29/7373* (2013.01); *H01L 29/7606* (2013.01); *H01L 29/872* (2013.01)

(58) Field of Classification Search
CPC ............... H01L 29/045; H01L 29/1602; H01L 29/2003; H01L 29/267; H01L 29/7373; H01L 29/7606; H01L 29/872
See application file for complete search history.

(56) References Cited

U.S. PATENT DOCUMENTS

| | | |
|---|---|---|
| 5,362,975 A | 11/1994 | Windheim et al. |
| 5,476,812 A | 12/1995 | Kimoto et al. |

(Continued)

OTHER PUBLICATIONS

International Search Report and Written Opinion issued in counterpart PCT Application No. PCT/US2018/016870 dated May 24, 2018.

(Continued)

*Primary Examiner* — Sue A Purvis
*Assistant Examiner* — Scott Stowe
(74) *Attorney, Agent, or Firm* — Olive Law Group, PLLC

(57) ABSTRACT

Certain embodiments include a cubic boron nitride (c-BN) device. The c-BN device includes a n/n+ Schottky diode and a n/p/n+ bipolar structure. The n/n+ Schottky diode and the /p/n+ bipolar structure are on a single-crystal diamond platform.

1 Claim, 2 Drawing Sheets

(51) Int. Cl.
*H01L 29/76* (2006.01)
*H01L 29/872* (2006.01)

(56) References Cited

U.S. PATENT DOCUMENTS 5,834,840 A 11/1998 Robbins et al.
2016/0247745 A1 8/2016 Perkins et al.

OTHER PUBLICATIONS

International Preliminary Report on Patentability issued in counterpart PCT Application No. PCT/US2018/016870 dated Aug. 13, 2019 (five (5) pages).

FIG. 1(a) Epitaxial growth of diamond on sapphire with EBSD pattern; FIG. 1(b) Raman (using 633 nm source) spectrum with 1332 cm-1 peak with inset carrier concentration vs 1/T

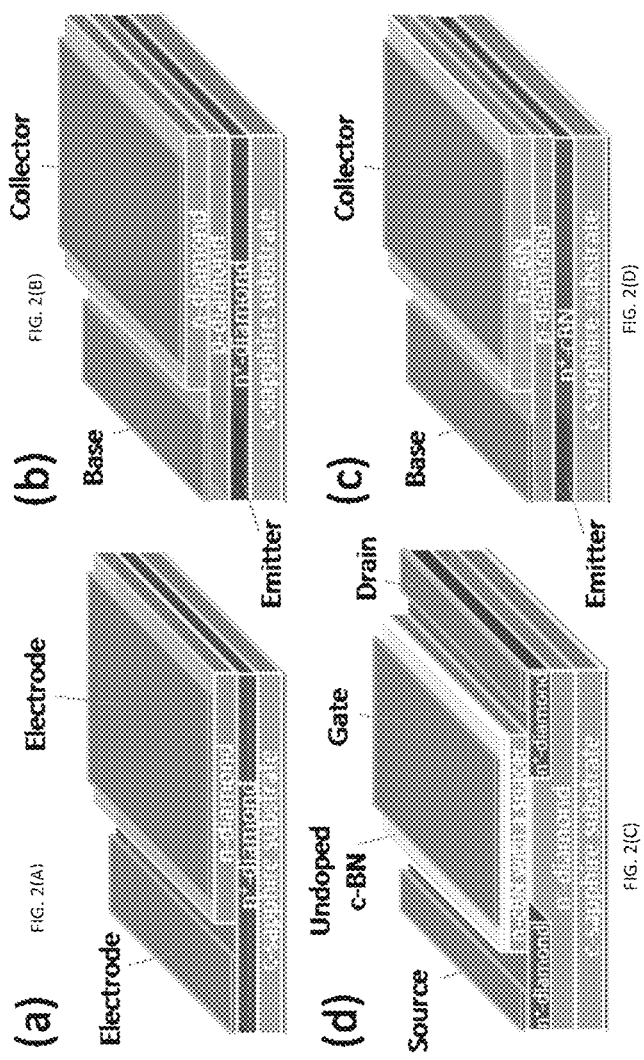
Figure 2: Proposed diamond and c-BN based device structures. (a) and (b) show the n/n⁺ Schottky diode and n/p/n⁺ BJT, all based on diamond, while (c) depicts a heterojunction BJT utilizing c-BN/diamond/c-BN layers. (d) illustrates the concept of diamond FETs with modulation doping in the high energy gap c-BN layer for both high carrier density and mobility.

DOPING AND FABRICATION OF DIAMOND AND C-BN BASED DEVICE STRUCTURES

CROSS-REFERENCE TO RELATED APPLICATIONS

This disclosure claims priority to U.S. Provisional Application No. 62/456,706, titled "Novel doping and Fabrication of Diamond and c-BN based Device Structures," filed Feb. 9, 2017, the entirety of which is hereby incorporated by reference herein.

GOVERNMENT LICENSE RIGHTS

This invention was made with government support under grant number W911NF-16-1-0375 awarded by the Army Research Office and grant number 1560838 awarded by the National Science Foundation. The government has certain rights to this invention.

TECHNICAL FIELD

The present disclosure relates generally to diamond and cubic boron nitride (c-BN) devices and more specifically (although not necessarily exclusively), n- and p-type doping for forming diamond and c-BN devices.

BACKGROUND

Certain electrical systems (e.g., electric power grid systems, electrical energy transmission or distribution systems, etc.) may use one or more devices that are inefficient and/or exposed to environmental hazards. Moreover, certain methods for manufacturing components of such electrical systems can be governed by conventional equilibrium thermodynamics, which can limit the capabilities of the manufactured components.

BRIEF DESCRIPTION OF THE DRAWINGS

FIG. 2(A) is a perspective view of a diamond and c-BN based device structure according to some aspects.

FIG. 2(B) is a perspective view of a diamond and c-BN based device structure according to another aspect.

FIG. 2(C) is a perspective view of a diamond and c-BN based device structure according to another aspect.

FIG. 2(D) is a perspective view of a diamond and c-BN based device structure according to another aspect.

DETAILED DESCRIPTION

Figure 1A:
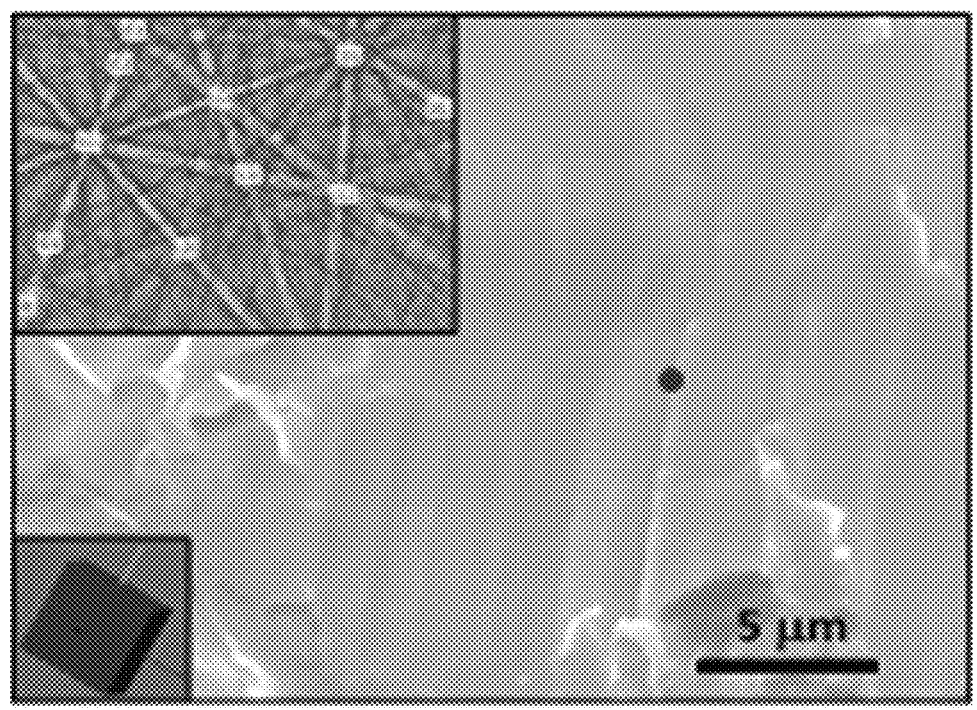
FIG. 1(a) is an image depicting Epitaxial growth of diamond on sapphire with an Electron Backscatter Diffraction ("EBSD") pattern according to some aspects.

Embodiments described herein involve a method of n- and p-type doping for fabricating diamond and cubic boron nitride (c-BN) based devices via non-equilibrium growth and doping control for ultra-high power applications beyond the current wide bandgap silicon carbide or III-nitride technologies. In some examples, a n/n+ Schottky diode and n/p/n+ bipolar structures are realized as prototype devices on a single-crystal diamond platform, in addition to vertical heterojunction bipolar transistors (e.g., c-BN/diamond/c-BN) and lateral field-effect transistors including those with modulation doping (e.g., doped c-BN barrier/diamond channel). In some examples, fabrication of such structures can be achieved by a synthesis approach based on direct conversion of amorphous carbon into diamond and h-BN into c-BN at ambient temperatures and pressures through nanosecond laser melting in a super undercooled state and subsequent rapid quenching in the domain matching epitaxy paradigm. In some instances, successful demonstration of previously unattainable structures in diamond and c-BN can provide a building block toward technological breakthroughs for high-temperature, high-power electronic applications beyond the current state of the art.

In some examples, embodiments described herein can modernize a conventional electric power grid, which may still be based on the technology from the early $20^{th}$ century. For example, power devices described herein utilizing ultra-wide bandgap diamond and c-BN can enhance the efficiency and reliability of electrical energy transmission or distribution systems with low loss, high power capacity in a compact design. In some examples, methods and systems described herein may provide a breakthrough that ensures the United States' lead in smart grid technologies.

Some existing power distribution systems are based on highly inefficient and bulky transformers that are also exposed to environmental hazards. In some examples, an electric grid infrastructure (e.g., energy internet) described herein utilizes solid-state devices with smart sensing, which can eliminate overloads and reroute power to minimize the outage. Further, utilizing solid=state devices with smart sensing can allow bi-directional flow of electrical energy and allow the electric grid infrastructure to handle the power generated from a variety of sources with disparate characteristics. In some examples, conventional high-power devices based on GaN and SiC are faced with certain, potentially insurmountable, limitations which include lateral doping and electrical activation. In some instances, diamond and c-BN devices described herein can offer more promising alternatives owing to their extremely large breakdown fields, low dielectric constants, high carrier mobility, record thermal conductivity, and high-temperature stability. For example, the Johnson's figure of merit (relevant for high-power devices) for diamond and c-BN is close to 8200 compared to 900 for 4H-SiC and 490 for GaN. In some instances, the two materials (e.g., diamond and c-BN) can be improved semiconductors for high-power, high-temperature electronic applications.

In some instances, while diamond and c-BN can have unparalleled physical and chemical properties suitable for high-power devices as also indicated by favorable figures of merit (see Table 1 below for comparison), realization of device quality materials may be difficult due to a number of fundamental reasons. For instance, synthesis of large-area epitaxial single-crystal diamond or c-BN films on a practical substrate can be difficult. In the case of diamond, the growth methods based on CVD may face a competition between $sp^2$ bonded carbon and $sp^3$ bonded diamond. As a result, a fraction of residual $sp^2$ bonded carbon underneath and around diamond grains at the grain boundaries can create a problem for diamond epitaxy and phase purity. As for boron nitride, the hexagonal phase (h-BN) with large directional anisotropy is usually the more stable form; the desired cubic crystal (c-BN) can only be grown under extremely high-temperature, high-pressure conditions with a significant limit in the resulting submicron sample size. Further, doping these materials for meaningful free carrier concentrations has been a formidable challenge; particularly, n-type diamond is a decades-old pursuit due to the low thermodynamic solubility limits and high ionization energies.

In some examples, embodiments described herein can represent a shift of the paradigm and employ an approach that is different from conventional methods governed by the equilibrium thermodynamics, thus unhindered by the imposed limitations. For instance, a process or method described herein can be based upon melting of thin layer of amorphous carbon (or h-BN) under a highly undercooled state using high-power nanosecond lasers at ambient temperature and pressure, followed by rapid quenching. In some instances, by controlling the degree of undercooling and quenching rate, molten carbon (or h-BN) can be quenched into diamond (c-BN) or an allotrope with various properties. In some examples, providing an epitaxial template such as sapphire, can allow diamond or c-BN to grow from the liquid phase into a large-area single-crystal film by domain matching epitaxy, where integral multiples of lattice planes match across the film-substrate interface. Furthermore, in some examples, large-area single-crystal films can be doped with p- and n-type dopants through alloying before the melting stage. During the rapid quenching process from the liquid-phase, dopant concentrations can far exceed thermodynamic solubility limits through the solute trapping phenomenon. This is critical for achieving desired concentrations of free carriers, as the donor/acceptor activation energies are generally large in both diamond and c-BN (e.g., hundreds of meV). Once the single-crystal film is formed on sapphire or silicon, it is also possible to stack additional layers of epitaxial diamond and/or c-BN through pulsed laser ablation with selected dopant types and concentrations. Accordingly, fabrication of multi-layer vertical homo- and hetero-junctions structures can be achieved using methods or processes described herein, realizing ultimately such devices as p-n diodes and bipolar transistors including the heterojunction varieties in this ultra-wide bandgap material system. The doping control in the in-plane direction is achieved by selective ion implantation and laser annealing, which can also be feasible via solute trapping in the melting/quenching process, planar devices including the field-effect transistors can be demonstrated. In some examples, modulation doping may also be achieved by embodiments described herein by taking advantage of the band offset between the diamond and c-BN layer, thus attaining high carrier density and mobility simultaneously. Embodiments described herein can offer an opportunity for a breakthrough in the power electronics industry with unprecedented device performances.

TABLE 1

Comparison of key material properties and figure of merit for high-power applications.

| | Band Gap | Breakdown Field | Thermal Conductivity | Johnson Figure of Merit |
|---|---|---|---|---|
| GaN | 3.45 eV | ~3.3 MV/cm | 200 W/m · K | 490 |
| 4H—SiC | 3.23 eV | ~2.4 MV/cm | 370 W/m · K | 900 |
| Diamond | 5.47 eV | ~10 MV/cm | 2000 W/m · K | 8200 |
| c-BN | 6.40 eV | ~10 MV/cm | 1300 W/m · K | 8200 |

Figure 1B:
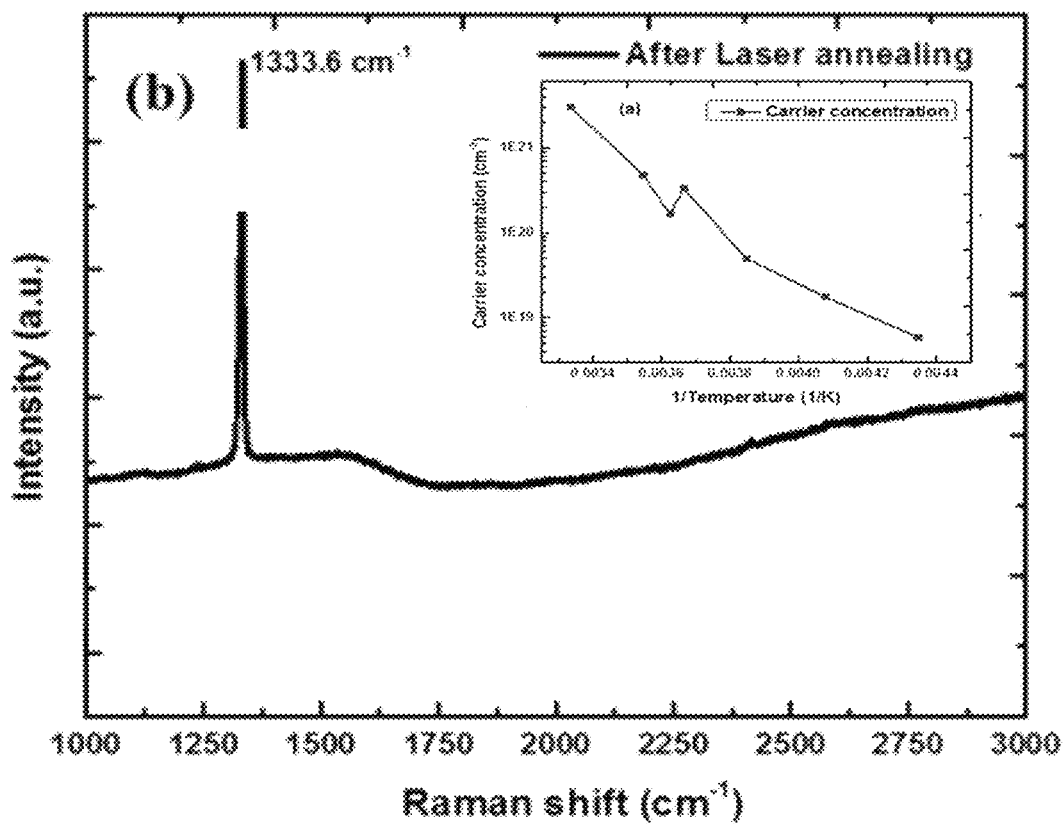
FIG. 1(b) is a graph depicting an example of Raman spectra results according to some aspects.

In some examples, carbon can be directly converted into nanodiamond, microdiamond, and large-area single crystal films after a single pulse of excimer laser irradiation of carbon films about 500 nm thick. In some examples, the large-area films examined by EBSD can show the characteristic diamond Kikuchi patterns as depicted in FIG. 1(a). Raman spectrum contains shows a sharp peak at 1332 cm$^{-1}$, characteristic of diamond without the presence of other carbon phases (FIG. 1b). The inset shows preliminary results on carrier concentration in N-doped diamond as a function of (1/T). The carrier concentration can vary from $2.0 \times 10^{18}$ to $5.0 \times 10^{21}$ cm$^{-3}$. These high concentrations can be the consequence of dopant trapping during rapid quenching. A fit to $n=\exp(-\Delta E/k_B T)$ suggests $\Delta E \sim 0.53$ eV. While these results are encouraging, systematic in-depth studies may be useful for unraveling the complex doping phenomena. FIG. 1(a) depicts epitaxial growth of diamond on sapphire with EBSD pattern. FIG. 1(b) Raman (using 633 nm source) spectrum with 1332 cm$^{-1}$ peak with inset carrier concentration vs 1/T.

Formation of large-area epitaxial single-crystal films of diamond on practical substrates (heteroepitaxy) can be a challenge as the interatomic potentials of diamond and c-BN are far stronger than substrate materials. In some instances, another challenge is doping, particularly n-type in diamond for two-fold reasons. First, larger size of n-type dopants have lower thermodynamic solubility limits, and second only a small fraction of these dopants are ionized to generate free carriers due to their large ionization energies. Embodiments described herein overcome this challenge by direct quenching of molten carbon into diamond via first-order phase transformation. Also processes and methods described herein allows incorporation of a much higher concentration of dopants into substitutional sites (far exceeding thermodynamic solubility limits) via solute trapping under rapid quenching from the melt. As a result, a smaller fraction of ionized dopants will lead to a much higher concentration of free carriers needed for solid state devices. Finally, device structures based on epitaxial doped structures of diamond and c-BN have been severely limited due to these challenges Formation of Large-Area Epitaxial Single-Crystal Films:

In some embodiments, equilibrium thermodynamics can be bypassed through kinetics by rapid melting and quenching using nanosecond lasers. From the highly undercooled state, we can quench into diamond phase. By providing appropriate substrates, epitaxial films by the paradigm of DME can be grown directly. The epitaxial growth will be first pursued for diamond on a (0001) sapphire substrate and then be extended to Si(111) and Si(100) substrates. The melting can be achieved by using ArF (193 nm), KrF (248 nm) and XeCl (308 nm) laser pulses with pulse duration ranging from 20-35 ns. Since heating and quenching rates are a strong function of laser and substrate variables, the nucleation and growth of diamond is a strong function of laser substrate variables. For example, thermal conductivity of the substrate can play a critical role in the formation of Q-carbon.

Doping of Diamond and c-BN:

The as-deposited carbon films are doped during deposition (for example, in the case of N-doping) and by subsequent ion implantation for P, As and Sb dopants. In one example, the N-dopant incorporation can been achieved as a function of nitrogen partial pressure during carbon thin film deposition. The results can be compared with those obtained by low-energy nitrogen ion implantation. Further, these n-type dopants can also be incorporated by using the ablation targets which have desired amounts of dopants. Similarly, the p-type doping is achieved by co-deposition of B during laser ablation of amorphous carbon, followed by laser melting. For c-BN, p-type doping is achieved by Zn and n-type by Si. As the size of dopants increases, the equilibrium thermodynamic solubility limit decreases because of the increase in strain free energy. However, under rapid melting and quenching, the solubility limit can be exceeded by utilizing the phenomenon of solute trapping.

The optical properties of as-deposited carbon films are analyzed first by using Raman and photoluminescence, since the photon-solid interactions during laser irradiations depend critically on them.

Demonstration of Prototype Devices (p-n Junctions) in Epitaxial Diamond and Diamond/c-BN Heterostructures:

In some examples, a precise control on the dopant distribution can be achieved to create sharp junctions. The formation of uniformly doped n-type layer by pulsed laser melting and quenching, followed by pulsed laser deposition of p-doped layer (the second crystalline layer) at low temperatures around 500° C., can yield a very sharp and robust p-n junctions. This process can also involve single-chamber in-situ processing, where all the steps to form p-n junctions are accomplished in the same chamber without breaking the vacuum, which can be an important consideration for scale-up manufacturing. FIG. 2 shows the formation of a Schottky and a bipolar transistor. In some examples, diamond/c-BN mixed bipolar, δ-FET and MOSFET devices can also be created.

Formation of Abrupt Lateral Junctions:

The control in the lateral doping profile crucial for the contact formation can be achieved via additional ion implantation at high dose (16 KeV, $5 \times 10^{15}$ ions $cm^2$) in the selected regions of the amorphous carbon film [that is already doped with $P^+$ at low does; 100 KeV, $5 \times 10^{14}$ ions $cm^{-2}$] through masks before laser melting and cooling of the entire carbon film (single ArF pulse with energy density ~0.6 $Jcm^{-2}$). The heavily and lightly doped diamond regions will grow epitaxially through domain matching epitaxy. Due to the rapid quenching (over billion degrees per second), abrupt junctions are expected at the interfaces with dopant densities well beyond the solubility limits, as depicted in FIGS. 2(A)-2(D). FIGS. 2(A)-2(D) depict diamond and c-BN based device structures. FIGS. 2(A) and 2(B) show the n/n+ Schottky diode and n/p/n+ BJT, all based on diamond, while FIG. 2(C) depicts a heterojunction BJT utilizing c-BN/diamond/c-BN layers. FIG. 2(D) illustrates the concept of diamond FETs with modulation doping in the high energy gap c-BN layer for both high carrier density and mobility.

Modulation Doping of Diamond/c-BN Multilayer Structures:

A c-BN layer doped with C or Si (n-type) will be grown epitaxially on the converted diamond film, as depicted in FIG. 2(A), by pulsed laser deposition with the dopants incorporated into the laser target. As an intended growth temperature can be 300-500° C., dopant densities can also exceed the solubility limits via the nonequilibrial nature of the PLD process. The growth of doped c-BN will be preceded and followed by that of undoped c-BN for the modulation doped structure, as depicted in FIGS. 2(A)-2(D).

What is claimed is:

1. A heterojunction bipolar junction transistor comprising: an $n^+$ c-BN/sapphire single-crystal platform; and c-BN/diamond/c-BN layers on the platform.

* * * * *